(12) United States Patent
Thiara

(10) Patent No.: US 6,747,506 B1
(45) Date of Patent: Jun. 8, 2004

(54) CHARGE PUMP ARCHITECTURE

(75) Inventor: Raman S. Thiara, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/325,051

(22) Filed: Dec. 20, 2002

(51) Int. Cl.[7] ................................................ G05F 1/10
(52) U.S. Cl. ........................ 327/537; 327/536; 327/437
(58) Field of Search ................................. 327/537, 536, 327/437, 157, 158, 105, 156

(56) References Cited

U.S. PATENT DOCUMENTS

| 5,598,209 A | * | 1/1997 | Cortjens et al. | ............... 38/211 |
|---|---|---|---|---|
| 5,625,306 A | * | 4/1997 | Tada | ........................... 327/112 |
| 5,889,437 A | * | 3/1999 | Lee | .............................. 331/16 |
| 6,611,160 B1 | * | 8/2003 | Lee et al. | .................... 327/157 |

* cited by examiner

Primary Examiner—Dinh T. Le
(74) Attorney, Agent, or Firm—Buckley, Maschoff and Talwalkar LLC

(57) ABSTRACT

According to some embodiments, a charge pump includes a first transistor to steer an amount of current to a second transistor coupled to the first transistor in a first folded cascode arrangement and to a current mirror to sink substantially the amount of current from a load, and a third transistor to steer the amount of current to a fourth transistor coupled to the third transistor in a second folded cascode arrangement to source substantially the amount of current to the load.

10 Claims, 6 Drawing Sheets

CHARGE PUMP ARCHITECTURE

BACKGROUND

Charge pumps are used to source current to or sink current from a load in response to control signals. Typically, these control signals consist of an UP signal and a DOWN signal. Current is sourced to the load in a case that the UP signal is active and the DOWN signal is inactive, and current is sunk from the load in a case that the UP signal is inactive and the DOWN signal is active. Ideally, no current flows through the load if both control signals are in the same state.

In a non-ideal charge pump, some current flows to or from the load if both control signals are in the same state. This current is known as leakage current. Leakage current may be reduced for a particular charge pump by tri-stating the output and/or increasing the output impedance of the charge pump.

A non-ideal charge pump also introduces delays into the system in which it is implemented. For example, many charge pumps employ switched current mirror structures. When a current is mirrored, the speed by which a current is switched through the mirror is limited by the device transit frequency of the transistors comprising the mirror. These delays may be significant in a case that the device transit frequency is similar to the phase detector comparison rate, which is the rate at which the charge pump control signals are updated. Hence, conventional charge pumps using switched current mirrors provide current matching at the expense of speed.

FIG. 1 illustrates a conventional differential charge pump that does not employ a current mirror. Charge pump 1 includes p-channel metal-oxide semiconductor (PMOS) transistor 2. Transistor 2 receives voltage signal $V_{CMFB}$ from a common-mode feedback amplifier and generates a current which results in a stable common-mode voltage at the output of charge pump 1.

A drain of transistor 2 is coupled to sources of PMOS transistor 3 and PMOS transistor 4. Drains of transistors 3 and 4 are respectively coupled to drains of n-channel metal-oxide semiconductor (NMOS) transistor 5 and NMOS transistor 6, and source terminals of transistors 5 and 6 are coupled to one another and to current source $I_1$. These elements operate to generate differential output signal component OUT_N based on the differential charge pump control signals UP (composed of component signals UP and UPB) and DOWN (composed of DN and DNB). Charge pump 1 uses a second set of the above-described elements to generate differential output signal component OUT_P. However, the components of the UP and DOWN differential control signals are applied to the second set of elements in a different arrangement.

Charge pump 1 therefore uses PMOS current switches stacked on NMOS current switches to steer the UP and DOWN signals to a load. These current switches require high output impedance because they are directly coupled to the output of charge pump 1. This direct coupling also presents problems with signal feedthrough. Additionally, since the current switches are both PMOS and NMOS, charge pump 1 may require level shifting of the differential control signals. Level shifting may be required to allow for enough voltage dynamic range at the output of charge pump 1. Yet another drawback of charge pump 1 is its use of local feedback, which complicates its design.

DETAILED DESCRIPTION

Figure 1:
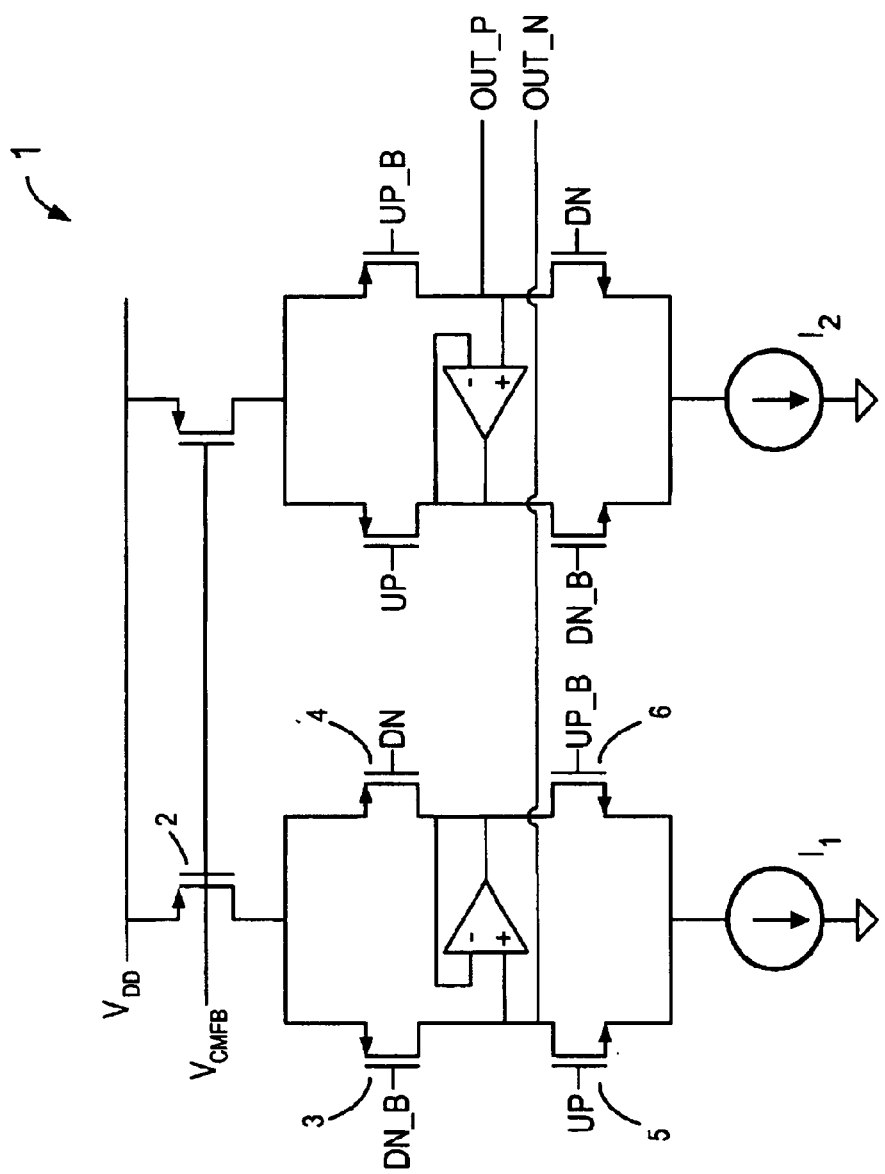
FIG. 1 is a diagram illustrating a conventional charge pump.
Figure 2:
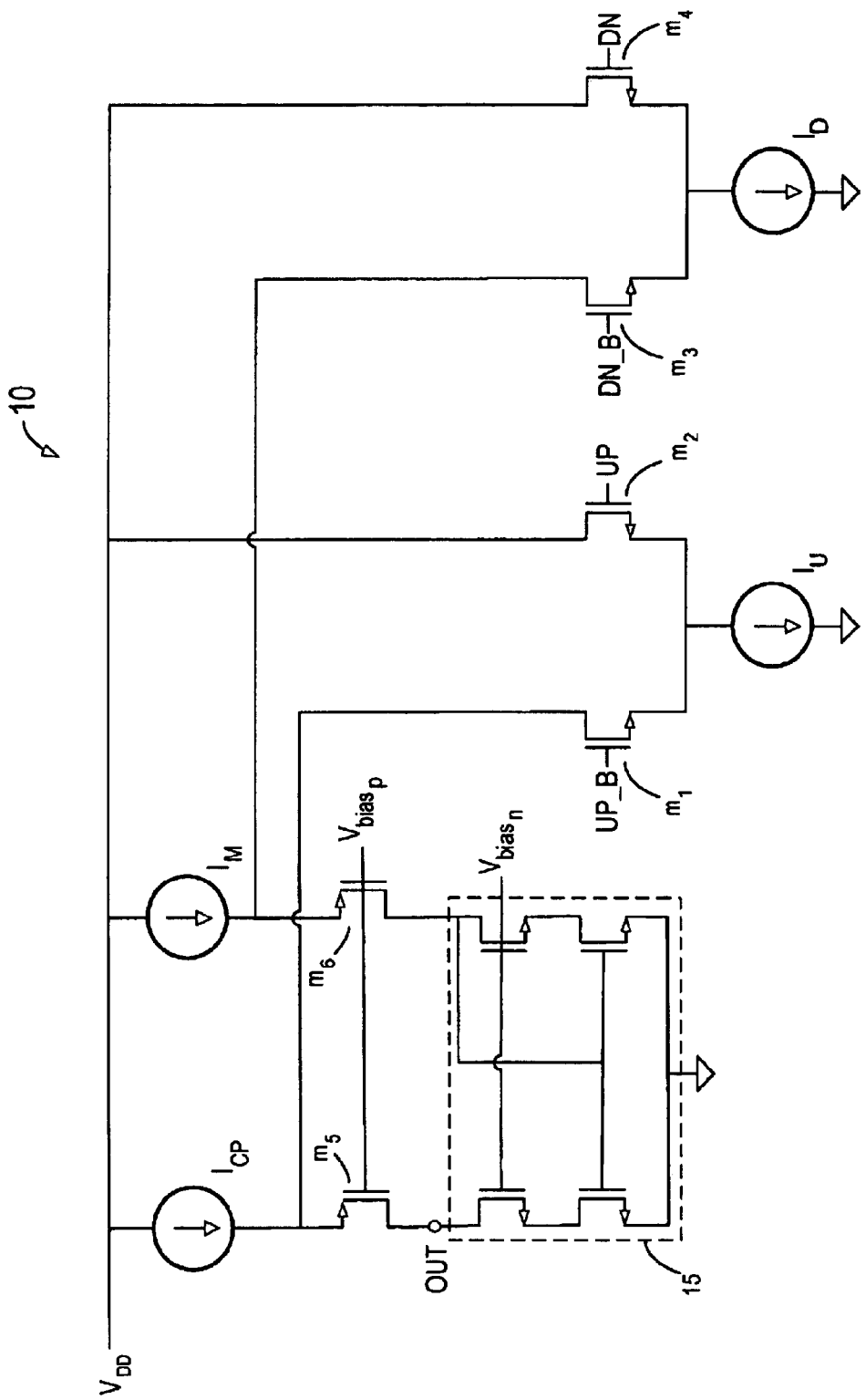
FIG. 2 is a diagram of a charge pump according to some embodiments.

FIG. 2 illustrates charge pump 10 according to some embodiments. As described with respect to FIG. 1, the UP and DOWN control signals used to control charge pump 10 are differential control signals, each composed of two components (UP & UPB, DN & DNB) which together define a state of a respective differential control signal. Charge pump 10 steers a current I so as to source or sink current I at output node OUT based on the control signals. Although charge pump 10 includes only one output, charge pump 10 may be modified as described below to output a differential signal.

Current sources $I_M$, $I_{CP}$, $I_U$ and $I_D$ in FIG. 2 each generate a current equal to I. Charge pump 10 also includes current switches comprising NMOS transistors $m_1$ through $m_4$. Each of transistors $m_1$ through $m_4$ receives a respective component of the differential control signals. A source of transistor $m_1$ is coupled to a source of transistor $M_2$ and to current source $I_U$. Also, a source of transistor $m_3$ is coupled to a source of transistor $m_4$ and to current source $I_D$.

A drain of transistor $m_1$ is coupled to a source of PMOS transistor $m_5$ in a folded cascode arrangement. A drain of transistor $m_5$ is in turn coupled to an output of NMOS current mirror 15 and to output node OUT. A drain of transistor $m_3$ is also coupled in a folded cascode arrangement to a source of PMOS transistor $m_6$, and a drain of transistor $m_6$ is coupled to an input of current mirror 15. Current mirror 15 generates at its output any current that is present at its input.

To explain the operation of charge pump 10, it will be assumed that the UP differential control signal is inactive and the DOWN differential control signal is active. Corresponding values of component signals UP, UP_B, DN and DN are low, high, high and low, respectively. Since transistors $m_1$ through $m_4$ are NMOS-type, these values cause transistors $m_1$ and $m_4$ to conduct current and cause transistors $m_2$ and $m_3$ to block current flow.

As mentioned above, $I_{CP}=I=I_U$. Current I therefore flows through conducting transistor $m_1$, and no net current flows through transistor $m_5$. Current I from current source $I_M$ does not flow through non-conducting transistor $m_3$, but rather flows through transistor $m_6$ and to the input of current mirror 15. Current I is mirrored in amplitude and direction at the output of current mirror 15. Since no current flows through transistor $m_5$, the mirrored current I sinks from output node OUT.

In a case that that the UP differential control signal is active and the DOWN differential control signal is inactive, values of component signals UP, UP_B, DN and DN_B are high, low, low and high, respectively. These values cause transistors $m_2$ and $m_3$ to conduct current and cause transistors $m_1$ and $m_4$ to block current flow. $I_{CP}=I$ flows through transistor $m_5$ since no current flows through transistor $m_1$. Current I flows through transistor ms because $I_M=I_D=I$, resulting in no net current flow through transistor $m_6$.

Consequently, no current flows at the input or the output of current mirror 15. The current I flowing through transistor m₅ therefore flows entirely to output node OUT.

Figure 3:
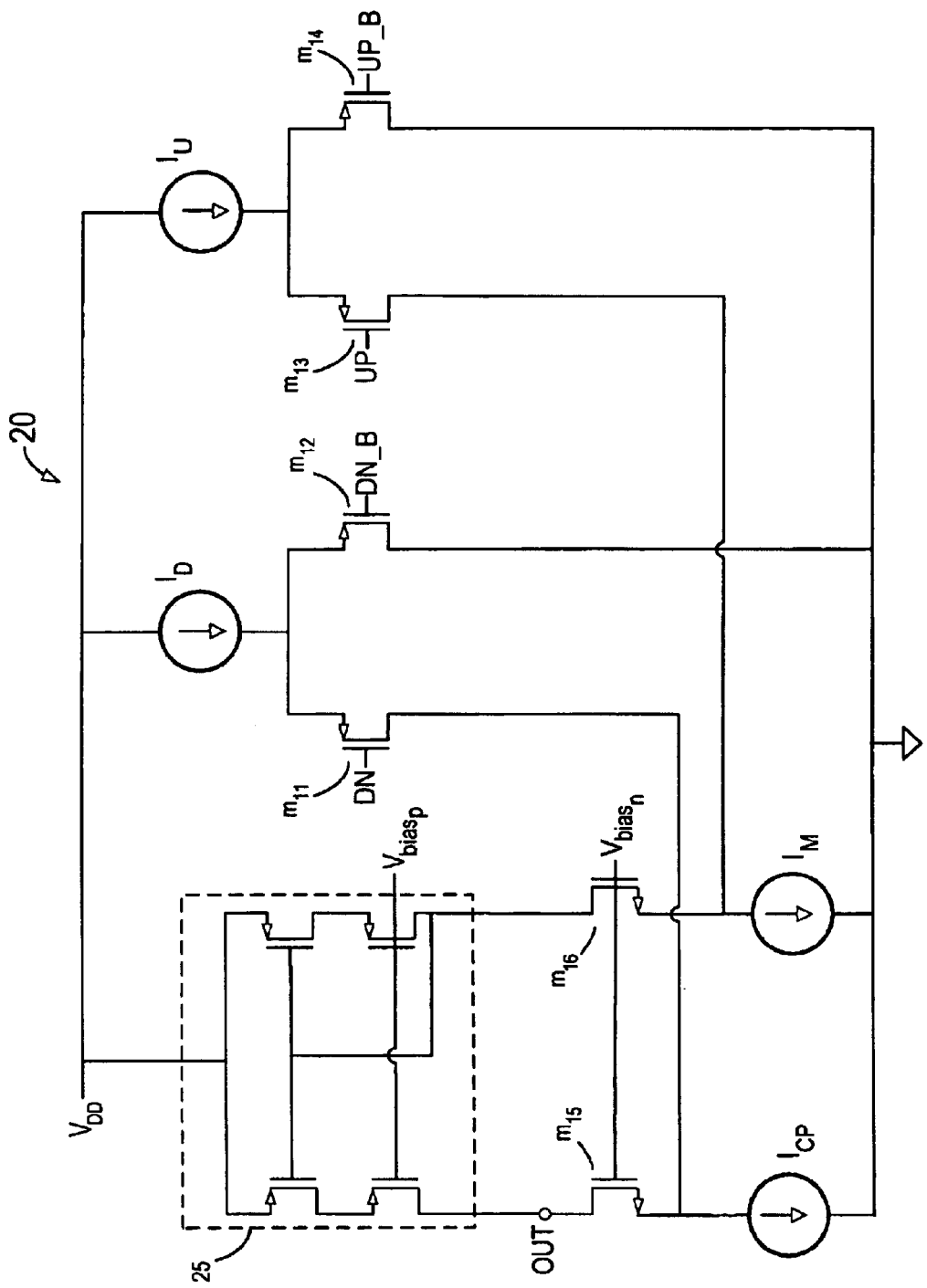
FIG. 3 is a diagram of a charge pump according to some embodiments.

FIG. 3 illustrates charge pump 20 according to some embodiments. Charge pump 20 also steers a current I so as to source or sink current I at output node OUT based on components of differential charge pump control signals. Charge pump 20 differs from charge pump 10 in that current switches $m_1$ through $m_{14}$ are PMOS transistors and current mirror 25 is also comprised of PMOS transistors. Again, current sources $I_M$, $I_{CP}$, $I_U$ and $I_D$ each generate a current equal to I.

A source of transistor $m_{11}$ is coupled to a source of transistor $m_{12}$ and to current source $I_D$, while a source of transistor $m_{13}$ is coupled to a source of transistor $m_{14}$ and to current source $I_U$. A drain of transistor $m_{11}$ is coupled to a source NMOS transistor $m_{15}$ in a folded cascode arrangement, and a drain of transistor $m_{15}$ is in turn coupled to an output of current mirror 25 and to output node OUT. A drain of transistor $m_{13}$ is also coupled in a folded cascode arrangement to a source of NMOS transistor $m_{16}$, and a drain of transistor $m_{16}$ is coupled to an input of current mirror 25.

One example of operation of charge pump 20 will be described below with respect to an inactive UP differential control signal and an active DOWN differential control signal. Corresponding values of component signals UP, UP__B, DN and DN__B are low, high, high and low. Since transistors $m_{11}$ through $m_{14}$ are PMOS-type, these values cause transistors $m_{12}$ and $m_{13}$ to conduct current and cause transistors $m_{11}$ and $m_{14}$ to block current flow.

Current I therefore flows through transistor $m_{13}$ and no current flows through transistor $m_{16}$. Accordingly, no net current flows at the input of output of current mirror 25. Current $I_{CP}$=I flows through transistor $m_{15}$ because no current flows through transistor $m_{11}$. Since no current flows at the output of current mirror 25, current I that flows through transistor $m_{15}$ is sunk from output node OUT. Charge pump 10 and charge pump 20 therefore both sink current I from an output node in response to an inactive UP differential control signal and an active DOWN differential control signal.

Charge pump 10 and charge pump 20 therefore use a current mirror to either sink or source current, but not to sink and source current. Such an arrangement may offer low voltage headroom and reasonably high-speed operation.

Figure 4:
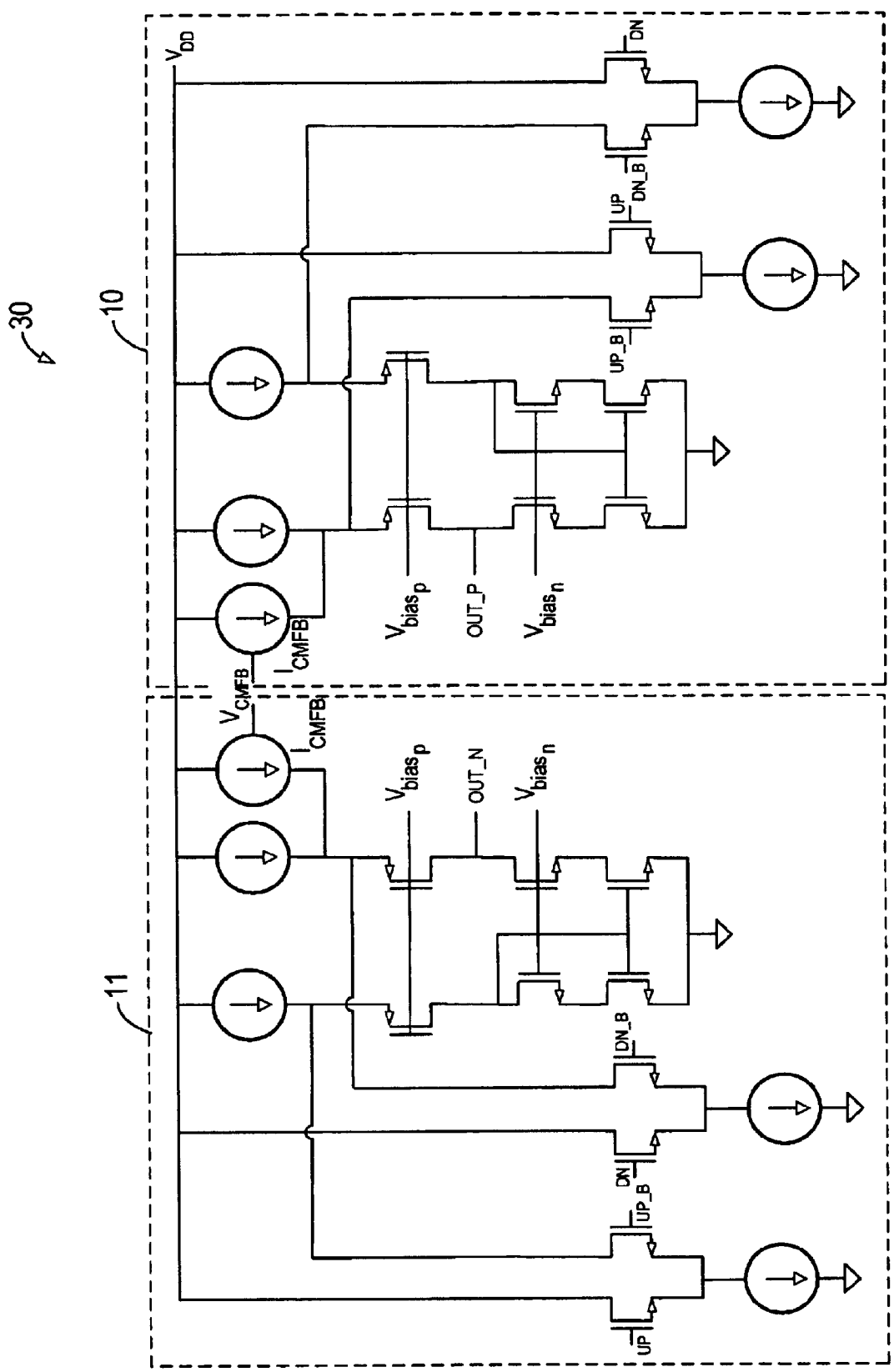
FIG. 4 is a diagram of a differential-output charge pump according to some embodiments.

FIG. 4 illustrates fully-differential charge pump 30 according to some embodiments. As a fully-differential charge pump, charge pump 30 receives differential control signals UP and DOWN and generates a differential output signal based thereon. As shown, charge pump 30 utilizes charge pump 10 to generate the OUT__P component of the differential output signal.

Charge pump 30 utilizes charge pump 11 to generate the OUT__N component of the differential output signal. Charge pump 11 is identical to charge pump 10 except that a drain of the NMOS transistor receiving the DN__B component is coupled to an output of the current mirror rather than to an input of the current mirror. Similarly, a drain of the NMOS transistor receiving the UP__B component is coupled to the input of the current mirror rather than to its output. These differences result in an OUT__N component that is opposite to the OUT__P component generated by charge pump 10 in response to identical UP and DOWN control signals.

Figure 5:
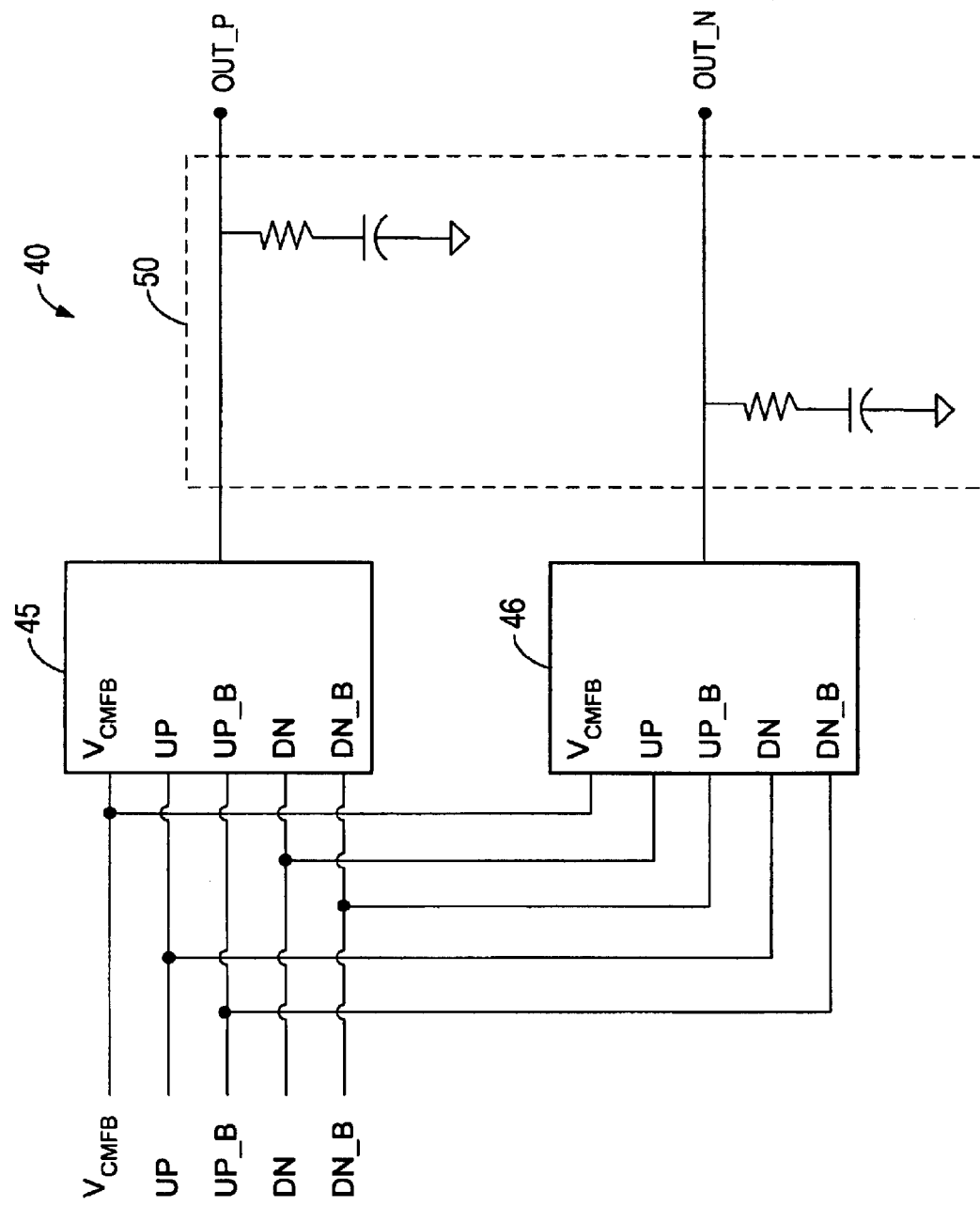
FIG. 5 is a block diagram of a differential-output charge pump according to some embodiments.

A more general structure of a fully-differential charge pump is illustrated in FIG. 5. Charge pump 40 includes charge pumps 45 and 46, each of which may be implemented by charge pump 10. As shown, a particular set of control signals UP, UP__B, DN and DN__B is applied to the inputs of charge pump 45 as described above with respect to charge pump 10. The control signals are applied differently to charge pump 46, with the UP signal applied to the DN input (transistor $m_4$), the UP__B signal applied to the DN__B input (transistor $m_3$), the DN signal applied to the UP input (transistor $m_2$) and the DN__B signal applied to the UP__input (transistor $m_1$). Buffer 50 buffers and/or provides required impedance levels for output signals OUT__P and OUT__N.

Charge pumps 45 and 46 differ from charge pump 10 by the inclusion of current source $I_{CMFB}$. Current sources $I_{CMFB}$ and $I_{CP}$ together generate a current equal to I by virtue of voltage signal $V_{CMFB}$. More specifically, current source $I_{CMFB}$ receives voltage signal $V_{CMFB}$ from a common-mode feedback amplifier (not shown). The common-mode feedback amplifier receives output signals OUT__P and OUT__N from charge pumps 45 and 46, detects a common-mode output voltage of charge pump 40 based on the received output signals, receives a common-mode reference voltage, and generates output voltage signal $V_{CMFB}$ based on the detected common-mode voltage and the reference voltage.

One advantage of a fully-differential charge pump according to some embodiments are the similar speeds by which current is sunk from or sourced to a load. Moreover, a fully-differential charge pump according to some embodiments may only require matching of differential source currents and matching of differential sink currents, rather than matching of source currents to sink currents.

Figure 6:
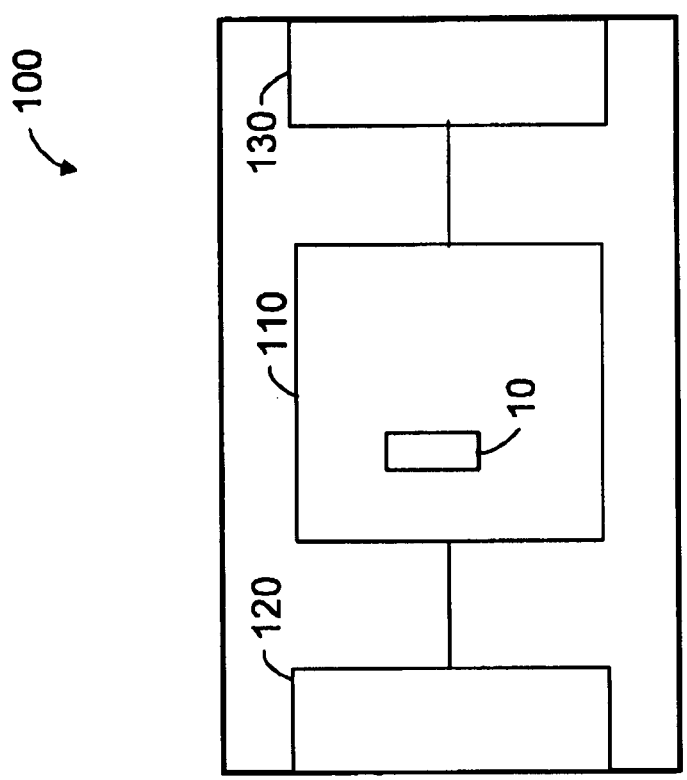
FIG. 6 is a block diagram of a system according to some embodiments.

FIG. 6 is a block diagram of a system according to some embodiments. System 100 includes transceiver chip 110 for receiving and transmitting data. Transceiver chip 110 includes charge pump 10 within a Clock and Data Recovery (CDR) circuit. The CDR circuit is used to extract a clock to retime the data received by transceiver chip 110.

Such a signal may be received from optical interface 120. Optical interface 120 is coupled to transceiver 110, receives electrical signals from transceiver 110, and transmits optical signals based on the received electrical signals. Optical interface 120 also receives optical signals and transmits electrical signals to transceiver 110 based on the received optical signals.

Backplane interface 130 is also coupled to transceiver 110. Electrical signals are transmitted between transceiver 110 and a backplane (not shown) through backplane interface 130. System 100 may be embodied in a communications module. The communications module may in turn be an element of a line card used to transmit and receive data to and from an optical medium.

Charge pump 10 may also be embodied in a Phase-Lock Loop or other circuit requiring one or more of high output impedance, high speed of operation, high output dynamic range, low leakage current and decreased device matching requirements such as those relating to static phase error in certain clock and data recovery loops. However, embodiments need not possess all or any of these characteristics.

The several embodiments described herein are solely for the purpose of illustration. Embodiments may include any currently or hereafter-known current sources, switches and current mirrors. Therefore, persons skilled in the art will recognize from this description that other embodiments may be practiced with various modifications and alterations.

What is claimed is:

1. A charge pump comprising:
   a first transistor of a first type, a gate of the first transistor to receive a first component of a first differential charge pump control signal;
   a second transistor of a second type, a source of the second transistor coupled to a drain of the first transistor, and a drain of the second transistor coupled to an output node;
   a third transistor of the first type, a gate of the third transistor to receive a first component of a second differential charge pump control signal;
   a fourth transistor of the second type, a source of the fourth transistor coupled to a drain of the third transistor; and
   a current mirror, an input of the current mirror coupled to a drain of the fourth transistor and an output of the current mirror coupled to the output node,
   wherein, in response to receipt of the first component of the first differential charge pump control signal in a first state, the first transistor is to steer an amount of current through the second transistor to source substantially the amount of current to the output node, and
   wherein, in response to receipt of the first component of the second differential charge pump control signal in the first state, the third transistor is to steer the amount of current through the fourth transistor to the input of the current mirror to sink the amount of current from the output node.

2. A charge pump according to claim 1, wherein the first differential charge pump control signal is an UP signal, and wherein the second differential charge pump control signal is a DOWN signal.

3. A charge pump according to claim 1, wherein the first differential charge pump control signal is a DOWN signal, and wherein the second differential charge pump control signal is an UP signal.

4. A charge pump according to claim 1, wherein the first type is NMOS and wherein the second type is PMOS.

5. A charge pump according to claim 1, wherein the first type is PMOS and wherein the second type is NMOS.

6. A charge pump according to claim 1, wherein the current mirror comprises transistors of the first type.

7. A charge pump according to claim 1, further comprising:
   a current source to output a current based on a common-mode feedback voltage signal.

8. A charge pump according to claim 1, further comprising:
   a fifth transistor of the first type to receive a second component of the first differential charge pump control signal, a source of the fifth transistor coupled to a source of the first transistor and to a first current source, and a drain of the fifth transistor coupled to a supply voltage; and
   a sixth transistor of the first type to receive a second component of the second differential charge pump control signal, a source of the sixth transistor coupled to a source of the third transistor and to a second current source, and a drain of the sixth transistor coupled to the supply voltage.

9. A system comprising:
   a transceiver comprising a charge pump, the charge pump comprising:
      a first transistor of a first type, a gate of the first transistor to receive a first component of a first differential charge pump control signal;
      a second transistor of a second type, a source of the second transistor coupled to a drain of the first transistor, and a drain of the second transistor coupled to an output node;
      a third transistor of the first type, a gate of the third transistor to receive a first component of a second differential charge pump control signal;
      a fourth transistor of the second type, a source of the fourth transistor coupled to a drain of the third transistor; and
      a current mirror, an input of the current mirror coupled to a drain of the fourth transistor and an output of the current mirror coupled to the output node,
      wherein, in response to receipt of the first component of the first differential charge pump control signal in a first state, the first transistor is to steer an amount of current through the second transistor to source substantially the amount of current to the output node, and
      wherein, in response to receipt of the first component of the second differential charge pump control signal in the first state, the third transistor is to steer the amount of current through the fourth transistor to the input of the current mirror to sink the amount of current from the output node; and
   an optical interface coupled to the transceiver to receive and to transmit optical signals.

10. A system according to claim 9, further comprising:
    a backplane interface coupled to the transceiver to receive and transmit electrical signals to a backplane.

* * * * *